US010288670B2

(12) United States Patent
Koellner et al.

(10) Patent No.: US 10,288,670 B2
(45) Date of Patent: May 14, 2019

(54) DIAGNOSIS APPARATUS AND METHOD FOR DETECTING A DEFECT OF AT LEAST ONE OF A PLURALITY OF LIGHT EMITTING DIODES

(71) Applicant: Continental Automotive GmbH, Hannover (DE)

(72) Inventors: Wolfgang Koellner, Vienna (AT); Maximilian Austerer, Vienna (AT); Philipp Brejcha, Ebensee (AT)

(73) Assignee: Continental Automotive GmbH, Hannover (DE)

( * ) Notice: Subject to any disclaimer, the term of this patent is extended or adjusted under 35 U.S.C. 154(b) by 315 days.

(21) Appl. No.: 15/294,026

(22) Filed: Oct. 14, 2016

(65) Prior Publication Data

US 2017/0131345 A1    May 11, 2017

(30) Foreign Application Priority Data

Oct. 14, 2015 (DE) .................. 10 2015 219 901

(51) Int. Cl.
*G01R 31/26* (2014.01)
*H05B 33/08* (2006.01)
(Continued)

(52) U.S. Cl.
CPC ....... *G01R 31/2635* (2013.01); *G01R 31/006* (2013.01); *G01R 31/44* (2013.01); *H05B 33/089* (2013.01); *H05B 33/0815* (2013.01); *H05B 33/0893* (2013.01); *B60Q 1/04* (2013.01); *B60Q 11/005* (2013.01)

(58) Field of Classification Search
None
See application file for complete search history.

(56) References Cited

U.S. PATENT DOCUMENTS 8,684,539 B2    4/2014   Suzuki
2006/0103500 A1*  5/2006   Kessler ................. H01C 10/08
                                                338/195
(Continued)

FOREIGN PATENT DOCUMENTS

CN        101275726 A    10/2008
CN        102548119 A    7/2012
(Continued)

*Primary Examiner* — Melissa J Koval
*Assistant Examiner* — Nasima Monsur

(57) ABSTRACT

The invention relates to a diagnosis apparatus for detecting a defect of at least one of a plurality of light emitting diodes which are interconnected to form a light emitting diode series connecting a first supply terminal to a second supply terminal. The defect is intended to be detected with little wiring outlay. The invention provides that a resistance element is connected in parallel with each light emitting diode and a measuring device is configured to generate a diagnosis current between the two supply terminals in a luminous pause, during which none of the light emitting diodes emit light, said diagnosis current giving rise, at each resistance element, to a voltage lower than a forward voltage, starting from which the light emitting diode respectively connected in parallel emits light, and to provide a voltage value of a diagnosis voltage dropped between the supply terminals.

18 Claims, 1 Drawing Sheet

(51) Int. Cl.
*G01R 31/44* (2006.01)
*G01R 31/00* (2006.01)
B60Q 1/04 (2006.01)
B60Q 11/00 (2006.01)

(56) References Cited

U.S. PATENT DOCUMENTS

| | | | |
|---|---|---|---|
| 2006/0170287 A1* | 8/2006 | Ito | B60Q 11/005 |
| | | | 307/10.1 |
| 2007/0159750 A1* | 7/2007 | Peker | H05B 33/0869 |
| | | | 361/93.1 |
| 2008/0238344 A1 | 10/2008 | Isobe et al. | |
| 2009/0167190 A1* | 7/2009 | Hickey | H05B 33/0803 |
| | | | 315/129 |
| 2009/0203965 A1* | 8/2009 | Fujiyama | A61B 1/00096 |
| | | | 600/130 |
| 2010/0049454 A1 | 2/2010 | Irissou et al. | |
| 2012/0050697 A1* | 3/2012 | Suzuki | G03B 21/20 |
| | | | 353/85 |
| 2012/0074947 A1* | 3/2012 | Cortigiani | H05B 33/0845 |
| | | | 324/414 |

FOREIGN PATENT DOCUMENTS

| | | |
|---|---|---|
| DE | 10108132 A1 | 8/2002 |
| DE | 102008016153 A1 | 10/2008 |
| DE | 102009017989 A1 | 10/2010 |
| DE | 102015100605 A1 | 3/2015 |
| EP | 1235465 A2 | 8/2002 |

* cited by examiner

DIAGNOSIS APPARATUS AND METHOD FOR DETECTING A DEFECT OF AT LEAST ONE OF A PLURALITY OF LIGHT EMITTING DIODES

DETAILED DESCRIPTION

Figure 1:
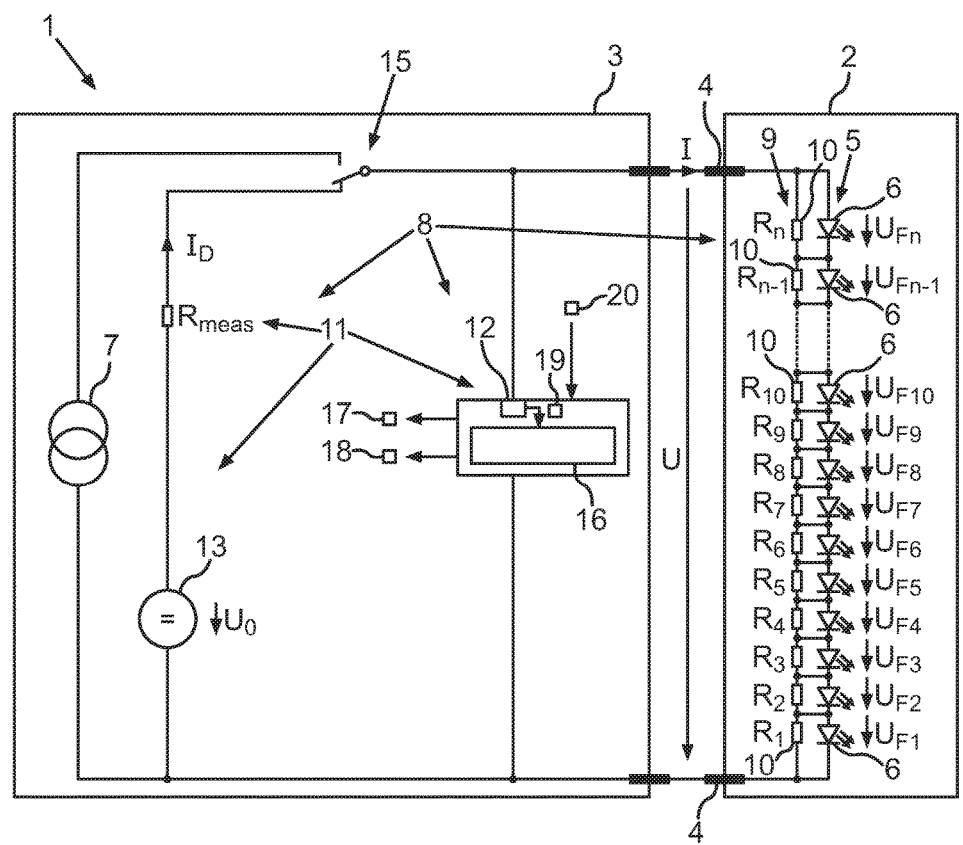
FIG. 1 shows a schematic illustration of an exemplary embodiment of a lighting apparatus.

The invention relates to a diagnosis apparatus and a method for detecting a defect of at least one of a plurality of light emitting diodes which are interconnected to form a light emitting diode series via which two supply terminals are connected to one another. The light emitting diode series can be provided in particular in a motor vehicle headlight. However, the light emitting diode series can also be part of domestic lighting or some other illumination apparatus.

In LED illuminants (LED—Light Emitting Diode) it is customary to connect to individual light emitting diodes in series in order to form LED strings or light emitting diode series and to supply them from a current source. In this case, an individual light emitting diode series can consist of more than ten individual light emitting diodes connected in series. A light emitting diode series typically has only two supply terminals in order to pass the current of the current source through the light emitting diode series.

A defect or failure of an individual light emitting diode can be identified in a diagnosis of the light emitting diode series. A defect can consist in the light emitting diode becoming permanently non-conducting, that is to say constituting an electrical open circuit. All the light emitting diodes then fail since the current of the current source can no longer be conducted. A defect can also consist in the defective light emitting diode becoming permanently electrically conducting, that is to say undergoing breakdown. In that case only the defective light emitting diode remains dark while it still conducts the current. A diagnosis for individual LED failure identification is important particularly in the case of LED illuminants for the automotive sector, in order to warn a user of a motor vehicle that the headlight thereof no longer has the legally prescribed minimum brightness since at least one light emitting diode has failed. In general, the entire motor vehicle headlight is then deactivated in order thereby to simulate a blown incandescent bulb. As a result, the fault is then made discernible to the driver. What is particularly crucial, however, is that a fault signal is activated or generated in order to be able to warn or inform the driver via the dashboard.

Therefore, a light emitting diode failure identification or a detection of a defect of at least one of a plurality of light emitting diodes of a light emitting diode series is particularly relevant to safety.

The identification of an individual LED short circuit, that is to say a light emitting diode that has undergone breakdown or a permanently conducting light emitting diode, is difficult in the case of light emitting diode series comprising many light emitting diodes connected in series, since the voltage change generated by an individual LED short circuit between the supply terminals may be smaller than the nominal string voltage variations of the entire light emitting diode series. String voltage variations of LED strings or light emitting diode series are substantially generated by the following influences: manufacturing-dictated variations of the LED forward voltage $U_F$, nonlinear dependence of the LED forward voltage $U_F$ on the LED current, nonlinear dependence of the LED forward voltage $U_F$ on the LED junction temperature, variable voltage drops at plug contacts and lines, which may additionally exhibit a different temperature dependence than the LED forward voltage changes on account of the LED junction temperature change.

In addition, the problem of individual LED short-circuit identification is made more difficult by the fact that the voltage value to which the LED forward voltage $U_F$ decreases in the case of a short circuit is not clearly definable.

In this respect, U.S. Pat. No. 8,843,331B2 discloses connecting a detector circuit in parallel with each light emitting diode of a light emitting diode series for an individual LED failure identification, said detector circuit evaluating an electrical voltage dropped across the respective light emitting diode. Each detector circuit then individually generates a failure signal if the parallel-connected light emitting diode is identified as defective. What is disadvantageous about this solution is that a great wiring outlay results since a dedicated detector circuit has to be connected in parallel with each light emitting diode.

The invention is based on the object of providing a detection of a defect of a light emitting diode in a light emitting diode series, which detection is to be realized with little outlay.

The object is achieved by means of the subjects of the independent patent claims. Advantageous developments of the invention arise by virtue of the features of the dependent patent claims.

The invention provides a diagnosis apparatus for detecting a defect of at least one of a plurality of light emitting diodes which are interconnected to form a light emitting diode series or a light emitting diode string. The light emitting diode series connects a first supply terminal to a second supply terminal.

The diagnosis apparatus is able to identify a defect of at least one light emitting diode, without measuring individual voltages at the light emitting diodes for this purpose. Rather, it is merely necessary to measure the electrical voltage dropped between the supply terminals, that is to say the string voltage or summation voltage of the voltages dropped across the individual light emitting diodes. For this purpose, according to the invention it is provided that a resistance element is connected in parallel with each light emitting diode and a measuring device is designed to generate a diagnosis current between the two supply terminals in a luminous pause, during which none of the light emitting diodes emits light. A resistance element can be realized for example by a discrete electrical resistor, for example an SMD component. A resistance element can also be integrated into each light emitting diode. The diagnosis current is designed in such a way that it gives rise, at each resistance element, to a voltage lower than a forward voltage. The forward voltage is that voltage starting from which the light emitting diode respectively connected in parallel emits light. The measuring device provides or detects a voltage value of a diagnosis voltage dropped between the supply terminals. The diagnosis apparatus thus provides overall for connecting a series of resistance elements in parallel with the light emitting diode series, wherein the respective resistance elements are electrically connected in each case to an anode and a cathode of the associated light emitting diode via transverse lines or connection lines.

The invention affords the advantage that a voltage value of the diagnosis voltage generated by a diagnosis current depends on the number of defective or nonfunctional light emitting diodes in the light emitting diode series and in this case a relative difference in the voltage values for a different number of defective light emitting diodes can be evaluated in a simple manner because the tolerances for the measurement are determined by the tolerances of the parallel resistances, which can be chosen with ±1% tolerance without any problems, for example, and not by the large tolerances of the LEDs.

The invention also includes optional developments whose features afford additional advantages.

One development enables the automatic generation of a fault signal in the case of a defect of at least one light emitting diode. This development provides for an evaluation device to be designed to determine a total resistance value of an electrical resistance—effective between the supply terminals—of the resistance elements and of the light emitting diodes depending on a current intensity value of the diagnosis current and a voltage value of the diagnosis voltage and to generate a fault signal depending on the total resistance value. This development has the advantage that the total resistance value is dependent on the respective resistance value of the resistance elements and the imponderables that arise in the case of a breakdown or short circuit of an individual light emitting diode on account of the unknown forward voltages can thus be compensated for by the choice of the resistance values of the resistance elements. The fault signal can be generated if the total resistance value is smaller than the sum of the resistance values of the resistance elements minus a predetermined tolerance value. The tolerance value can compensate for a measurement accuracy of the measuring device, for example. The fault signal then signals a breakdown or short circuit of at least one light emitting diode. The abovementioned evaluation device can be realized for example on the basis of a microprocessor or a microcontroller.

Instead of the diagnosis current, it is also possible to generate an operating current having a magnitude such that it puts all the functional light emitting diodes into a luminous state. If one of the light emitting diodes is then defective to the effect that it permanently blocks a current flow (electrical open circuit), then this results in a value of the diagnosis voltage that is greater than the sum of the forward voltages of the light emitting diodes. Consequently, this defect can also be identified.

One development even makes it possible to identify how many light emitting diodes have failed. In this development, a plurality of overlap-free value intervals are defined in the evaluation device. The evaluation device is designed to signal a number of the defective light emitting diodes by means of the fault signal depending on in which of the value intervals the total resistance value lies. If all the light emitting diodes are functional, then the total resistance value yields the sum of the resistance values of the resistance elements. If a light emitting diode has been short-circuited or undergone breakdown, then the total resistance value yields the sum of the resistance values of the resistance elements minus the resistance value of the resistance element bridged by the light emitting diode that has undergone breakdown. In the case of two defective light emitting diodes that have each undergone breakdown, the total resistance value decreases accordingly.

One development enables a reliable detection of the at least one defective light emitting diode with little technical outlay. In this development, the resistance elements have a tolerance which is less than 2 percent. In other words, the resistance values of the resistance elements are known to a greater accuracy than 2 percent. Resistance elements having a tolerance of less than 2 percent are available at low cost. Nevertheless, the tolerance of the resistance values is an important aspect for obtaining a clear difference in the voltage value of the diagnosis voltage such as arises in the case of a failure of a light emitting diode.

With one development, the respective resistance value of each resistance element is at least ten times, in particular fifty times, greater than a respective resistance value of the parallel-connected light emitting diode in its defect state having undergone breakdown. The resistance value of each resistance element is thus significantly greater than the LED resistance to be identified in the case of a fault. Significantly greater is understood to mean at least one order of magnitude, i.e. at least a factor of 10. In particular, the respective resistance value of each resistance element is at least 20 ohms, in particular at least 50 ohms. The actual design criterion for the parallel resistance, however, is that it is intended to be greater than the resistance value of the short-circuited LED such that the short circuit thereof can still just be identified. Suitable resistance values can thus be determined by the person skilled in the art on the basis of simple experiments. One advantage of these resistance values is that in normal operation, that is to say during a luminous phase, in which the functional light emitting diodes emit light, a low power loss arises at the respective resistance elements. A further advantage is that the total resistance value between the supply terminals changes by almost the resistance value if a light emitting diode permanently has undergone breakdown or is electrically conducting. Specifically, such a defective light emitting diode has a resistance value that may be less than 5 ohms, in particular less than 2 ohms.

One development provides for the resistance elements all to have the same resistance value. The evaluation of the diagnosis voltage is simple as a result. It is possible to use the same threshold values or limit values for detecting a defective light emitting diode since the resulting change in the diagnosis voltage is independent of which light emitting diode is defective.

By contrast, an alternative development provides for at least two, in particular all, of the resistance elements to have different resistance values. This affords the advantage that on the basis of the total resistance value it is possible to identify or derive or deduce which light emitting diodes in the light emitting diode series are defective.

One development provides for that current source which is provided for generating the operating current for the luminous phase also to generate the diagnosis current. This affords the advantage that there is no need to provide an additional source for generating the diagnosis current in the diagnosis apparatus.

An alternative development thereto provides for a voltage source different from the current source to be provided for generating the diagnosis current. In this development, the diagnosis apparatus thus comprises a current source for generating an operating current for a luminous phase, in which the light emitting diodes emit light, and a voltage source different therefrom for generating the diagnosis current. This affords the advantage that a current source which in terms of circuitry is simpler and/or more cost-effective can be used for generating the operating current. The reason for this is that the current source does not have to be able to provide both of the different current intensity values such as are necessary for the operating current, on the one hand, and the diagnosis current, on the other hand.

The development concerning the additional voltage source additionally comprises, in accordance with one development, a switching element electrically coupling the current source and the voltage source. The measuring device is designed to keep the switching element in an electrically non-conducting state in the luminous phase and in an electrically conducting state in the luminous pause, while no light emitting diode emits light. This advantageously prevents the operating current from flowing away via the voltage source.

By means of the described diagnosis current in the luminous pause, it is possible to detect a light emitting diode that has undergone breakdown in the light emitting diode series. One development additionally provides for the diagnosis apparatus to be designed to detect a voltage jump in an operating voltage dropped between the supply terminals in the luminous phase, which is caused by the operating current flowing through the luminous light emitting diodes. Furthermore, the diagnosis apparatus is designed to generate a failure signal if the absolute value of the voltage jump is greater than a predetermined threshold value. The voltage jump can be a voltage rise or a voltage drop. If an LED suddenly acquires high impedance, a voltage rise takes place. If an LED suddenly undergoes breakdown (short circuit), a voltage drop takes place. This development affords the advantage that even in the course of operation, while the light emitting diodes emit light, a change in the functionality of the light emitting diodes is detected, that is to say that a defect of at least one light emitting diode is identified on the basis of the transition from the functional state to the defective state and the resultant change in the operating voltage, that is to say the voltage jump.

A luminous pause is necessary for generating the diagnosis current. One development provides for the measuring device to be designed to generate the diagnosis current upon a start of the diagnosis apparatus before a start-up of the light emitting diodes. The start of the diagnosis apparatus constitutes the transition from the voltageless state to the voltage-supplied state. By way of example, upon a start of a motor vehicle it is thus possible to detect if a supply voltage is provided by the ignition of the motor vehicle. In addition or as an alternative thereto, it may be provided that in a pulse-width-modulated mode of operation of the light emitting diode series blanking periods are used, during which none of the light emitting diodes emits light or is operated. The diagnosis current is thus generated during a PWM switching pause (PWM—Pulse Width Modulation) of PWM operation of the light emitting diodes. This affords the advantage that a diagnosis can be made between two operating phases or luminous phases of the light emitting diode series.

The invention also includes a lighting apparatus comprising a plurality of light emitting diodes which are interconnected to form a light emitting diode series connecting a first supply terminal to a second supply terminal, wherein an embodiment of the diagnosis apparatus according to the invention is provided. The lighting apparatus thus comprises an embodiment of the diagnosis apparatus according to the invention.

Preferably, the lighting apparatus is embodied as a motor vehicle headlight.

However, the lighting apparatus can also be part of domestic lighting or some other illumination apparatus.

Finally, the invention also includes a method for detecting a defect of at least one of a plurality of light emitting diodes which are interconnected to form a light emitting diode series that connects a first supply terminal to a second supply terminal. The method is based on the fact that a resistance element is connected in parallel with each light emitting diode. A measuring device generates a diagnosis current between the two supply terminals in a luminous pause, during which none of the light emitting diodes emits light. The diagnosis current gives rise, at each resistance element, to a voltage lower than a forward voltage starting from which the light emitting diode respectively connected in parallel emits light. A diagnosis voltage dropped between the supply terminals is detected. The diagnosis voltage represents the string voltage or summation voltage. The method likewise affords the advantage that a voltage value of the diagnosis voltage is dependent on a number of the defective light emitting diodes and the influence of the variances of the forward voltages is reduced.

The invention also includes developments of the method according to the invention which have features such as have already been described in association with the developments of the diagnosis apparatus according to the invention. For this reason, the corresponding developments of the method according to the invention are not described again here.

One exemplary embodiment of the invention is described below. In this respect, the sole FIG. 1 shows a schematic illustration of one embodiment of the lighting apparatus according to the invention.

The exemplary embodiment explained below is one preferred embodiment of the invention. In the exemplary embodiment, the described components of the embodiment in each case constitute individual features of the invention which should be considered independently of one another and which develop the invention in each case also independently of one another and should thus also be regarded as part of the invention individually or in a different combination than that shown. Furthermore, the embodiment described can also be supplemented by further features of the invention from among those already described.

FIG. 1 shows a lighting apparatus 1, which can be configured for example as a motor vehicle headlight. An LED illuminant 2 and an LED control unit 3 are illustrated. The LED illuminant 2 is electrically connected to the LED control unit 3 via two supply terminals 4. In the LED illuminant 2, a light emitting diode series 5 comprising light emitting diodes 6 is connected between the supply terminals 4. For the sake of clarity, only some of the light emitting diodes 6 are provided with a reference sign. Overall, the light emitting diode series 5 comprises a total number n of light emitting diodes 6, wherein n is a natural number greater than 1. The LED control unit 3 is designed to provide a current I at the supply terminals 4. The current I brings about or generates a string voltage, or voltage U for short, between the supply terminals 4. For operation in which the light emitting diodes 6 are intended to emit light, the current I has a current intensity value that results in a forward voltage $U_{Fi}$ being dropped across each of the light emitting diodes 6. The index i here represents in each case one of the light emitting diodes 6, wherein the index i has a value of 1 to n. The current I having the current intensity value for the operating current is generated by the LED control unit by means of a current source 7.

In the case of the lighting apparatus 1 provision is made for monitoring the LED illuminant 2 to the effect of detecting whether at least one of the light emitting diodes 6 is defective. Individual diagnosis circuits for the individual light emitting diodes 6 are not necessary for this purpose. Instead, a diagnosis apparatus 8 is provided, comprising the following elements. Firstly, a resistance series 9 comprising resistance elements 10 is provided. Only some of the resistance elements 10 are provided with a reference sign, for the sake of clarity. Each resistance element 10 can be provided for example as a discrete component, that is to say as an electrical resistance component. A resistance element 10 can also be integrated into the respective light emitting diode 6. The resistance elements 10 each have a resistance value $R_i$, wherein i is once again the index for each resistance element. Overall, n resistance elements 10 are provided. Each resistance element 10 is connected in parallel with a respective one of the light emitting diodes 6. The diagnosis apparatus 8 furthermore comprises a measuring device 11 comprising a voltage measuring unit 12. The voltage measuring unit 12 detects the voltage U between the supply terminals 4 in a manner known per se. The measuring device 11 can furthermore comprise a voltage source 13 different from the current source 7. The voltage source 13 can generate a test voltage $U_0$. As an alternative thereto, the current source 7 itself can also constitute a part of the measuring device 11.

Optionally, a switch 15 can be provided, which can be controllable by the measuring device 11 and can be provided for electrically decoupling the current source 7 and the voltage source 13 from one another. By means of the switch 15, the current source 7 and the voltage source 13 can alternately be interconnected with or coupled or electrically connected to the light emitting diode series 5.

The diagnosis apparatus 8 can furthermore comprise an evaluation device 16, which can be provided for example on the basis of a microcontroller or a microprocessor or else on the basis of an analog electrical circuit. The evaluation device 16 can be designed to generate a fault signal 17 signaling that in the light emitting diode series 5 at least one light emitting diode 6 is permanently conducting or in a breakdown state. The evaluation device 16 can furthermore be designed to generate a failure signal 18 signaling that one of the light emitting diodes 6 has permanently undergone breakdown or is permanently electrically blocking or open-circuited. For this purpose, the evaluation device 16 receives a voltage value 19 of the voltage U from the voltage measuring unit 12. Furthermore, a current intensity value 20 of the current intensity of the current I is provided. The latter may be known in advance and permanently stored in the evaluation device 16. Provision may also be made for the current intensity value 16 to be determined by the measuring device 11 by means of the measurement resistance $R_{meas}$ if the current I is generated by the voltage source. On the basis of the test voltage $U_0$, the current intensity value I can likewise be calculated as $I=(U_0-U)R_{meas}$.

During a luminous phase, during which the current I is provided as operating current by the current source 7 and the light emitting diodes 6 are intended to emit light, a failure of a light emitting diode 6 would have the effect of the voltage U resulting as follows:

$$U<\Sigma_{i=1}^{n}U_{Fi}$$

A diagnosis on the basis of the difference between the voltage U and the sum of the forward voltages $U_{Fi}$ would be unreliable here, however, on account of the tolerances of the forward voltages $U_{Fi}$. In order to avoid the problem of the high tolerances of the forward voltages, the respective resistance element 10 is connected in parallel with each light emitting diode 6 in the diagnosis apparatus 8. Said resistance elements 10 can be procured cost-effectively with a low tolerance of less than 2 percent, for example 1 percent. In the dimensioning of these parallel resistance elements 10, for a reliable LED short-circuit identification it should be taken into consideration that for the resistance values $R_1$ of the resistance elements 10 the condition $R_i \gg R_{LED\text{-}short}$ should hold true, which means that the difference should be at least the factor 10. In this case, the resistance value $R_{LED\text{-}short}$ is the resistance value of a short-circuited light emitting diode or light emitting diode that has permanently undergone breakdown. The resistance values $R_i$ can either all have the same value, which enables a simple evaluation, or they can have different resistance values, which enables an allocation of the resistance change in the fault case of an LED short circuit to a specific light emitting diode 6.

For the diagnosis it is provided that the current I is set to a current intensity value that is less than the operating current. This current is designated here as diagnosis current $I_D$. In the case of this diagnosis current $I_D$, partial voltages of the voltage U which are less than the forward voltages $U_{Fi}$ arise across the light emitting diodes 6. A luminous pause thus arises, that is to say that the light emitting diodes 6 do not emit light. The diagnosis in the case of inactive light emitting diodes can be carried out either before the actual operating current is switched on, or during the PWM blanking periods or PWM switching pause in PWM operation of the light emitting diodes 6.

For the diagnosis measurement, the diagnosis apparatus 8 provides for the light emitting diode series 5, in the case of non-active light emitting diodes, that is to say in the case of diagnosis current $I_D$, to be supplied from either the current source 7 or the voltage source 13, such that a voltage value 19 that is less than the sum of the forward voltages $U_{Fi}$ is established as voltage U. The voltage U represents the diagnosis voltage in this case. Consequently, the comparatively small diagnosis current $I_D$ can be output either by the current source 7 itself that is kept available for LED operation, or, if said current source cannot generate such a small current, from a voltage source 13 via a measurement/protective resistance $R_{meas}$. In particular, the diagnosis current $I_D$ is designed in such a way that the voltage U is less than 60 percent, in particular less than 40 percent, of the sum of the forward voltages $U_{Fi}$. A diagnosis current $I_D$ generated by the voltage source 13 can flow through a measurement resistance $R_{meas}$. An electrical voltage dropped across the measurement resistance $R_{meas}$ is proportional to the current intensity value of the diagnosis current $I_D$.

By virtue of the fact that the partial voltages of the voltage U that are dropped across the light emitting diodes are lower than the forward voltages $U_{Fi}$, that is to say that none of the light emitting diodes 6 emits light, the majority of the current I flows through the resistance elements 10. Consequently, the voltage value 19 of the voltage U is principally determined by the current through the resistance elements $R_1$ to $R_n$. The voltage U arising as a result of the diagnosis current $I_D$ can be used by the evaluation device 16 for the identification of an LED short circuit, that is to say a breakdown of one or more light emitting diodes, as follows. A prerequisite here is that the current intensity value 20 of the diagnosis current $I_D$ is also known during the luminous pause. The detection can be carried out in the manner described.

For identifying the LED short circuit of one or more light emitting diodes, the evaluation device 16 is designed as follows. In the case of exclusively fault-free or functional light emitting diodes 6, the voltage U has a voltage value 19 that results as follows:

$$U=I_D\Sigma_{i=1}^{n}R_i$$

By contrast, if the measuring device 11 measures a string voltage U having the following value:

$$U=I_D\Sigma_{i=1}^{n-1}R_i,$$

then a resistance element 10 is short-circuited, that is to say that a resistance value $R_i$ is lacking, that is to say that there is a short-circuited light emitting diode in the light emitting diode series 5. In order that this significant change occurs, provision is made, in particular, for the resistance values $R_i$ to be greater than a respective resistance value of a short-circuited light emitting diode 6. At any rate, in the case of a short-circuited light emitting diode, a string voltage U arises in an interval which lies between the two indicated values for the voltage U and has an interval width calculated from $I_D R_i$. If the measuring device 11 measures a voltage value 19 having the following value:

$$U = I_D \Sigma_{i=1}^{n-2} R_i,$$

then two resistance elements 6 are short-circuited in each case by their light emitting diode 6 connected in parallel, that is to say that there are two defective light emitting diodes. This diagnosis can be continued for three or more short-circuited light emitting diodes.

The string voltage U can additionally be used by the evaluation device 16 for the identification of a permanently electrically non-conducting light emitting diode. Upon the energization of the illuminant 2 with a current I corresponding to the operating current, such that a luminous phase arises, the string voltage U rises to a value that is greater than the sum of the forward voltages $U_{Fi}$:

$$U > \Sigma_{i=1}^{n} U_{Fi},$$

which can likewise be identified by the evaluation device 16 by means of a threshold value detection. In this case, if necessary, upon activation of the failure signal 18, the evaluation device 16 turns off the current source 7 in order to prevent a destruction of electronic components by overvoltage.

During operation, a short circuit of one or more light emitting diodes 6 can be identified in a simple manner by way of a temporal change in the measured string voltage U. In this case, the tolerances of the forward voltages $U_{Fi}$ are unimportant since the evaluation device only has to react to a change or alteration of the string voltage U. In this case, changes in the forward voltages $U_{Fi}$ on account of heating can be differentiated from a defect or a failure of a light emitting diode on account of a short circuit straightforwardly by means of different time constants or by means of a temperature measurement.

What is advantageous compared with conventional detection methods is that the high tolerances of the forward voltages $U_{Fi}$ are eliminated and, as a result, a reliable individual LED short-circuit identification is possible even in the case of a light emitting diode string or a light emitting diode series 5 comprising a large number of light emitting diodes 6. Additional lines between the LED control unit 3 and the LED illuminant 2 are not required. The parallel resistances or resistance elements 10 are cost-effective components since they only have to be designed for a low power, these components taking up little space in the LED illuminant 2. Since the diagnosis current $I_D$ used for the diagnosis is low, possible voltage drops at plug pins and wiring harnesses can be disregarded for the diagnosis. The high reliability of the method also makes it possible to fulfill legal regulations for the individual LED failure identification.

The optional switch 15 described can be provided for the case where the intention is to prevent an undesirably high power loss from being generated in the measurement resistance $R_{meas}$ during luminous operation or in the luminous phase. By means of the switch 15, the voltage source 13 can be interconnected with or connected to the LED illuminant 2 temporarily for the diagnosis in order to provide the diagnosis current $I_D$.

Overall, the example shows how the invention makes it possible to provide an LED individual failure identification by means of parallel resistances.

The invention claimed is:

1. A diagnosis apparatus for detecting a defect of at least one of a plurality of light emitting diodes, the light emitting diodes interconnected to form a light emitting diode series connecting a first supply terminal to a second supply terminal, the diagnosis apparatus comprising:
   a resistance element connected in parallel with each light emitting diode of the plurality of light emitting diodes;
   a measuring device configured to generate a diagnosis current between the two supply terminals during a luminous pause, wherein none of the light emitting diodes emit light during the luminous pause, said diagnosis current giving rise, at each resistance element, to a voltage lower than a forward voltage, the forward voltage being voltage at which each light emitting diode respectively connected in parallel with the resistance element starts to emit light, and to provide a voltage value of a diagnosis voltage dropped between the supply terminals; and
   an evaluation device configured to determine a total resistance value of an electrical resistance—effective between the supply terminals—of the resistance elements and of the light emitting diodes depending on a current intensity value of the diagnosis current and the voltage value of the diagnosis voltage and configured to generate a fault signal depending on the total resistance value;
   wherein a plurality of overlap-free value intervals are defined in the evaluation device and the evaluation device is configured to signal a number of the defective light emitting diodes by means of the fault signal depending on in which of the value intervals the total resistance value lies.

2. The diagnosis apparatus as claimed in claim 1, wherein the resistance elements have a tolerance which is less than 2 percent.

3. The diagnosis apparatus as claimed in claim 1, wherein the respective resistance value of each resistance element is at least ten times greater than a respective resistance value of the parallel-connected light emitting diode in its defect state having undergone breakdown.

4. The diagnosis apparatus as claimed in claim 1, wherein the resistance elements all have the same resistance value.

5. The diagnosis apparatus as claimed in claim 1, wherein at least two of the resistance elements have different resistance values.

6. The diagnosis apparatus as claimed in claim 1, wherein all of the resistance elements have different resistance values.

7. The diagnosis apparatus as claimed in claim 1, further comprising:
   a current source for generating an operating current for a luminous phase, the luminous phase being a phase in which the light emitting diodes emit light, is configured to generate the diagnosis current.

8. The diagnosis apparatus as claimed in claim 7, wherein the diagnosis apparatus is configured to detect a voltage jump in an operating voltage dropped between the supply terminals in the luminous phase and configured to generate a failure signal if the absolute value of the voltage jump is greater than a predetermined threshold value.

9. The diagnosis apparatus as claimed in claim 1 further comprising:
a current source for generating an operating current for a luminous phase, the luminous phase being a phase in which the light emitting diodes emit light, and
a voltage source different from the current source, the voltage source configured to generate the diagnosis current.

10. The diagnosis apparatus as claimed in claim 9 further comprising:
a switching element coupling the current source and the voltage source, wherein the measuring device is configured to keep the switching element in a non-conducting state in the luminous phase and in a conducting state in the luminous pause.

11. The diagnosis apparatus as claimed in claim 1, wherein the measuring device is configured to generate the diagnosis current at least one of:
upon a start of the diagnosis apparatus before a start-up of the light emitting diodes, and
during a PWM switching pause of PWM operation of the light emitting diodes.

12. A lighting apparatus comprising:
a plurality of light emitting diodes which are interconnected to form a light emitting diode series connecting a first supply terminal to a second supply terminal, and
the diagnosis apparatus as claimed in claim 1.

13. The lighting apparatus as claimed in claim 12, wherein the lighting apparatus is comprised in a motor vehicle headlight.

14. The diagnosis apparatus as claimed in claim 1, further comprising:
a current source for generating an operating current for a luminous phase, the luminous phase being a phase in which the light emitting diodes emit light; and optionally
a voltage source different from the current source;
wherein one of the current source and the optional voltage source is configured to generate the diagnosis current;
wherein the resistance elements have a tolerance which is less than 2 percent;
wherein the respective resistance value of each resistance element is at least ten times greater than a respective resistance value of the parallel-connected light emitting diode in its defect state having undergone breakdown;
wherein the resistance elements are one of:
all having the same resistance value,
at least two but not all having different resistance values, and
all having different resistance values; and
wherein the measuring device is configured to generate the diagnosis current at least one of:
upon a start of the diagnosis apparatus before a start-up of the light emitting diodes, and
during a PWM switching pause of PWM operation of the light emitting diodes.

15. The diagnosis apparatus as claimed in claim 14 further comprising:
the voltage source different from the current source: and
a switching element coupling the current source and the voltage source, wherein the measuring device is configured to keep the switching element in a non-conducting state in the luminous phase and in a conducting state in the luminous pause.

16. A lighting apparatus comprising:
a plurality of light emitting diodes which are interconnected to form a light emitting diode series connecting a first supply terminal to a second supply terminal, and
the diagnosis apparatus as claimed in claim 15.

17. A lighting apparatus comprising:
a plurality of light emitting diodes which are interconnected to form a light emitting diode series connecting a first supply terminal to a second supply terminal, and
the diagnosis apparatus as claimed in claim 14.

18. A method for detecting at a measuring device a defect of at least one of a plurality of light emitting diodes which are interconnected to form a light emitting diode series connecting a first supply terminal to a second supply terminal, wherein a resistance element is connected in parallel with each light emitting diode, the method comprising the steps of:
generating a diagnosis current between the two supply terminals during a luminous pause, wherein none of the light emitting diodes emit light during the luminous pause, said diagnosis current giving rise, at each resistance element, to a voltage lower than a forward voltage, the forward voltage being voltage at which each light emitting diode respectively connected in parallel with the resistance element starts to emit light, and
providing a voltage value of a diagnosis voltage dropped between the supply terminals; and
determining a total resistance value of an electrical resistance—effective between the supply terminals—of the resistance elements and of the light emitting diodes depending on a current intensity value of the diagnosis current and the voltage value of the diagnosis voltage and generating a fault signal depending on the total resistance value;
wherein a plurality of overlap-free value intervals are defined; and
signaling a number of the defective light emitting diodes by means of the fault signal depending on in which of the value intervals the total resistance value lies.

* * * * *